United States Patent
Lin et al.

(10) Patent No.: US 9,503,022 B2
(45) Date of Patent: Nov. 22, 2016

(54) BALANCED UP-CONVERSION MIXER

(71) Applicant: National Chi Nan University, Puli, Nantou (TW)

(72) Inventors: Yo-Sheng Lin, Nantou (TW); Lun-Ci Liu, Nantou (TW); Chien-Chin Wang, Nantou (TW)

(73) Assignee: NATIONAL CHI NAN UNIVERISTY, Puli, Nantou (TW)

( * ) Notice: Subject to any disclaimer, the term of this patent is extended or adjusted under 35 U.S.C. 154(b) by 0 days.

(21) Appl. No.: 14/887,393

(22) Filed: Oct. 20, 2015

(65) Prior Publication Data

US 2016/0197583 A1  Jul. 7, 2016

(30) Foreign Application Priority Data

Jan. 7, 2015 (TW) .............................. 104100382 A

(51) Int. Cl.
*G06F 7/44* (2006.01)
*H03D 7/14* (2006.01)

(52) U.S. Cl.
CPC .................................. *H03D 7/1441* (2013.01)

(58) Field of Classification Search
CPC . H03D 7/1441; H03D 7/1491; H03D 7/1425
USPC ............... 327/355, 359, 356–358, 360, 361; 455/323, 326, 333
See application file for complete search history.

(56) References Cited

U.S. PATENT DOCUMENTS

2008/0198913 A1* 8/2008 Fan ................... H04L 25/03038
375/232

2014/0197874 A1* 7/2014 Tsai ..................... H03D 7/1441
327/359

OTHER PUBLICATIONS

Yo-Sheng Lin, et al., "A 12.1 mW 50-67 GHz Up-Conversion Mixer with 6 dB Conversion Gain and 30.7 dB LO-RF Isolation in 90nm CMOS", 2014 IEEE Radio and Wireless Symposium (RWS), Jan. 19-23, 2014, pp. 202-204.
Yu-Hsin Chang, et al., "A 24GHz Down-Conversion Mixer with Low Noise and High Gain", Proceedings of the 7th European Microwave Integrated Circuits Conference, Oct. 29-30, 2012, pp. 285-288.
Jeng-Han Tsai, et al., "A 25-75 GHz Broadband Gilbert-Cell Mixer Using 90-nm CMOS Technology", IEEE Microwave and Wireless Components Letters, vol. 17, No. 4, Apr. 2007, pp. 247-249.
Taiwanese Search Report from corresponding Taiwanese Patent Application No. 104100382, mailed Apr. 27, 2016.

* cited by examiner

*Primary Examiner* — Lincoln Donovan
*Assistant Examiner* — Thomas Skibinski
(74) *Attorney, Agent, or Firm* — Merchant & Gould P.C.

(57) ABSTRACT

A balanced up-conversion mixer includes: a negative resistance compensation circuit generating and outputting first and second currents based on a DC bias voltage; a mixing circuit allowing a differential radio frequency current (DRFC) signal pair to flow thereinto based on the first and second currents from the negative resistance compensation circuit, a differential oscillating voltage (DOV) signal pair and a differential intermediate frequency voltage (DIFV) signal pair; and a load circuit outputting a differential radio frequency voltage signal pair based on its impedance, the DC bias voltage and the DRFC signal pair. The DRFC signal pair has a frequency associated with those of the DOV and DIFV signal pairs.

7 Claims, 3 Drawing Sheets

BALANCED UP-CONVERSION MIXER

CROSS-REFERENCE TO RELATED APPLICATION

This application claims priority of Taiwanese Application No. 104100382, filed on Jan. 7, 2015.

FIELD

The disclosure relates to a mixer, and more particularly to a balanced up-conversion mixer.

BACKGROUND

Referring to FIG. 1, a conventional Gilbert mixer includes a load circuit 1 that is used to receive a direct current (DC) bias voltage (Vdd), and a mixing circuit 2.

The mixing circuit 2 includes a current source 21, a transduction unit 22 and a mixing unit 23.

The current source 21 is used to modulate a total bias current flowing therethrough. The transduction unit 22 is coupled between the current source 21 and the mixing unit 23, and is used to receive a differential intermediate frequency (IF) voltage signal pair that consists of positive-phase and negative-phase IF voltage signals. The transduction unit 22 is operative to allow a differential IF current signal pair to flow into the current source 21 therethrough based on the differential IF voltage signal pair. The differential IF current signal pair serves as the total bias current, and consists of positive-phase and negative-phase IF current signals ($I_{11}$, $I_{12}$). The mixing unit 23 is coupled between the transduction unit 22 and the load circuit 1, and is used to receive a differential oscillating voltage signal pair that consists of positive-phase and negative-phase oscillating voltage signals. The mixing unit 23 is operative to allow, based on the differential oscillating voltage signal pair, a differential radio frequency (RF) current signal pair flowing through the load circuit 1 to flow into the transduction unit 22 therethrough. The differential RF current signal pair consists of positive-phase and negative-phase RF current signals ($I_{21}$, $I_{22}$), and serves as the differential IF current signal pair.

The load circuit 1 outputs a differential RF voltage signal pair based on its impedance and on the positive-phase and negative-phase RF current signals ($I_{21}$, $I_{22}$). The differential RF voltage signal pair has a frequency which is a sum of those of the differential oscillating voltage signal pair and the differential IF voltage signal pair.

In such a configuration, upon DC analysis, since the current flowing into the transduction unit 22 flows entirely through the load circuit 1, power consumed by the load circuit 1 is relatively high. In addition, the conventional Gilbert mixer typically improves its self-conversion gain by increasing its power requirements. As a result, the conventional Gilbert mixer may have a further increased power consumption. In other words, the conventional Gilbert mixer cannot obtain a high conversion gain at low power consumption.

SUMMARY

Therefore, an object of the disclosure is to provide a balanced up-conversion mixer that can overcome the drawbacks of the prior art.

According to the disclosure, the balanced up-conversion mixer includes a negative resistance compensation circuit, a load circuit and a mixing circuit.

The negative resistance compensation circuit is used to receive a direct current (DC) bias voltage, and is configured to generate and output a first current and a second current based on the DC bias voltage.

The load circuit is used to receive the DC bias voltage.

The mixing circuit is coupled to the negative resistance compensation circuit and the load circuit for receiving the first and second currents therefrom, and is used to further receive a differential oscillating voltage signal pair and a differential intermediate frequency (IF) voltage signal pair. The mixing circuit is configured to allow a differential radio frequency (RF) current signal pair, which flows through the load circuit, to flow thereinto based on the first and second currents, the differential oscillating voltage signal pair and the differential IF voltage signal pair. The differential RF current signal pair has a frequency associated with those of the differential oscillating voltage signal pair and the differential IF voltage signal pair.

The load circuit outputs a differential RF voltage signal pair based on an impedance thereof, the DC bias voltage and the differential RF current signal pair.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
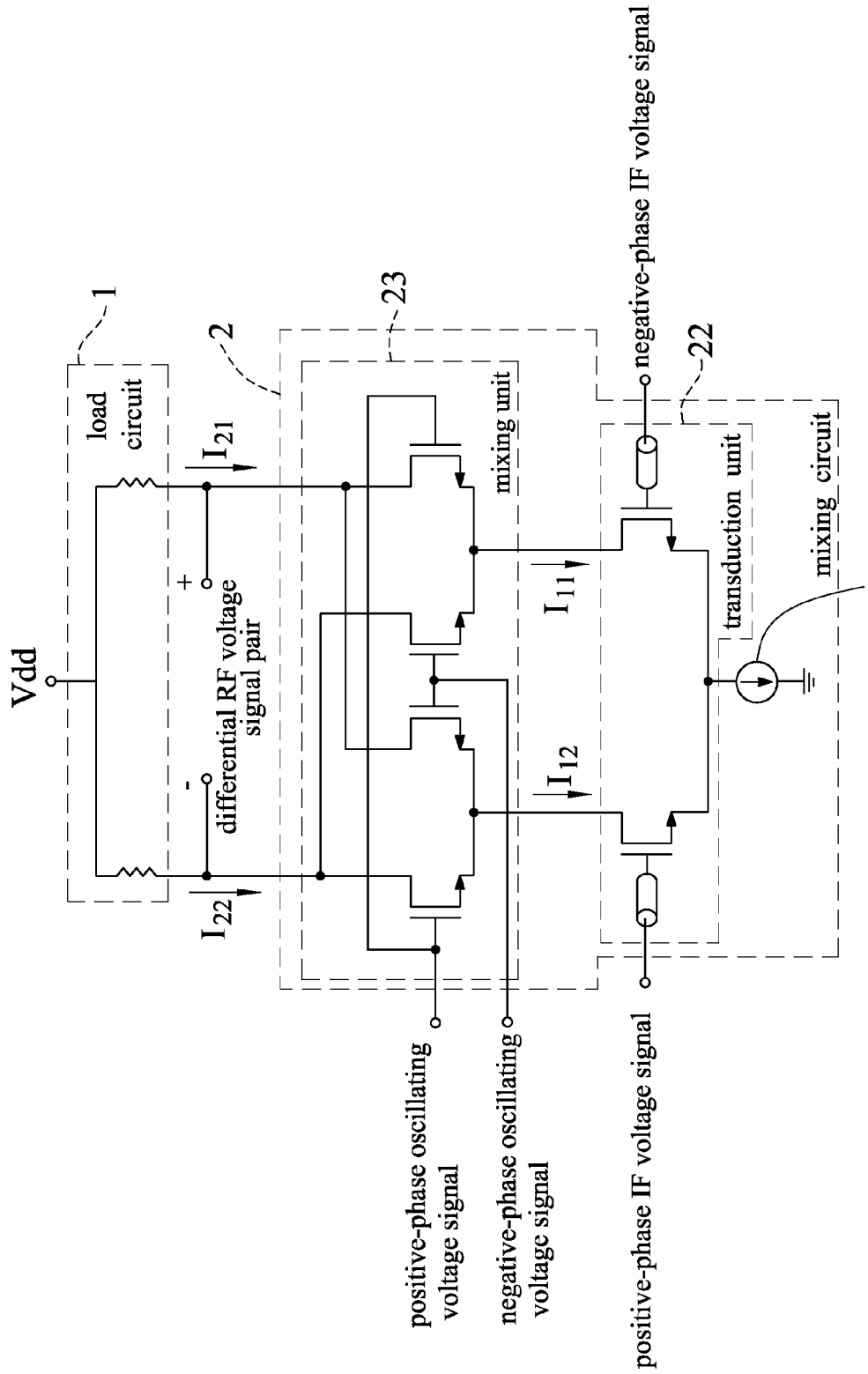
FIG. 1 is a schematic electrical circuit diagram illustrating a conventional Gilbert mixer.

Before the disclosure is described in greater detail, it should be noted that like elements are denoted by the same reference numerals throughout the disclosure. In addition, when two elements are described as being "coupled in series," "connected in series" or the like, it is merely intended to portray a serial connection between the two elements without necessarily implying that the currents flowing through the two elements are identical to each other and without limiting whether or not an additional element is coupled to a common node between the two elements. Essentially, "a series connection of elements," "a series coupling of elements" or the like as used throughout this disclosure should be interpreted as being such when looking at those elements alone.

Figure 2:
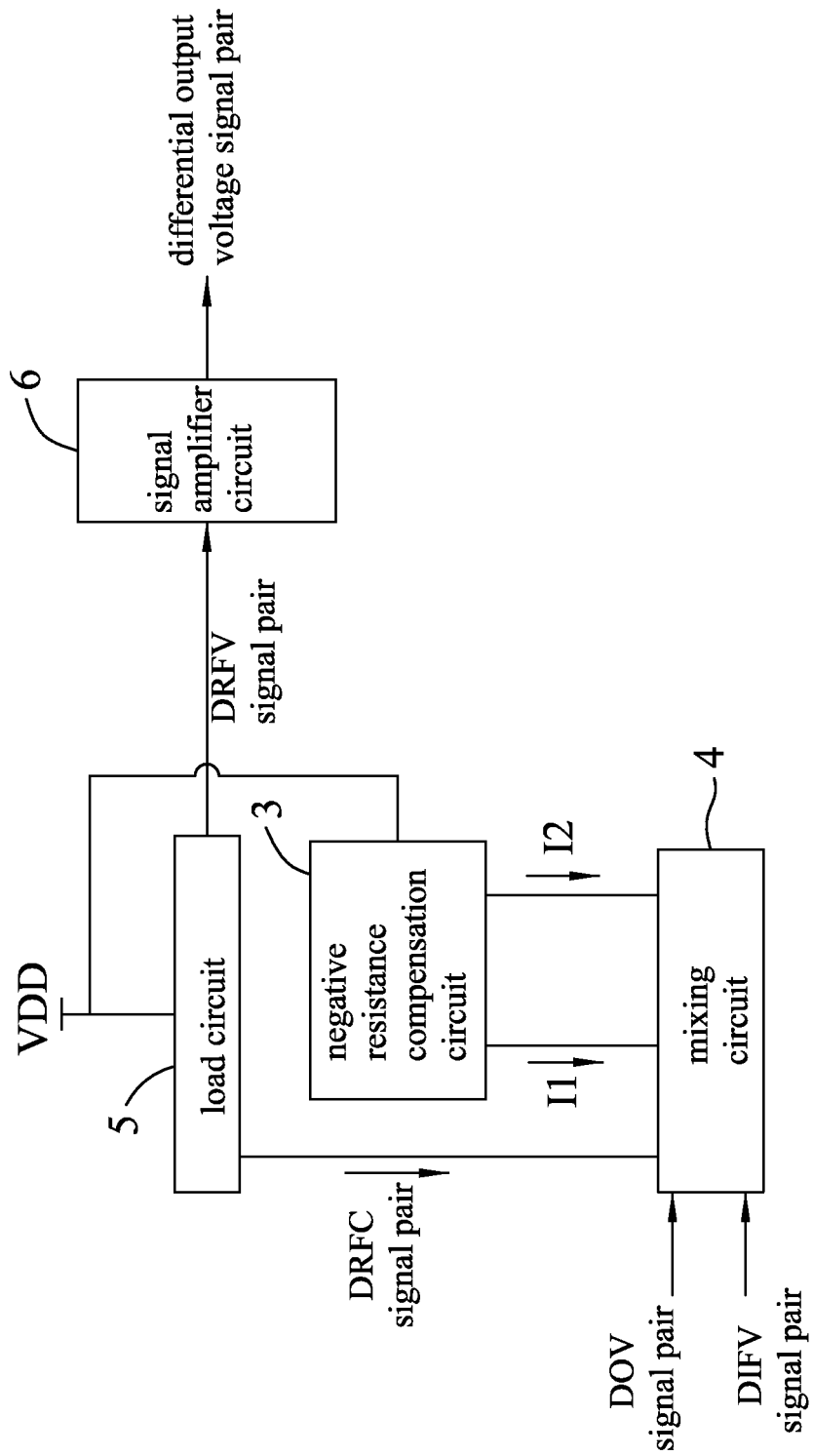
FIG. 2 is a schematic block diagram illustrating the embodiment of a balanced up-conversion mixer according to the disclosure.
Figure 3:
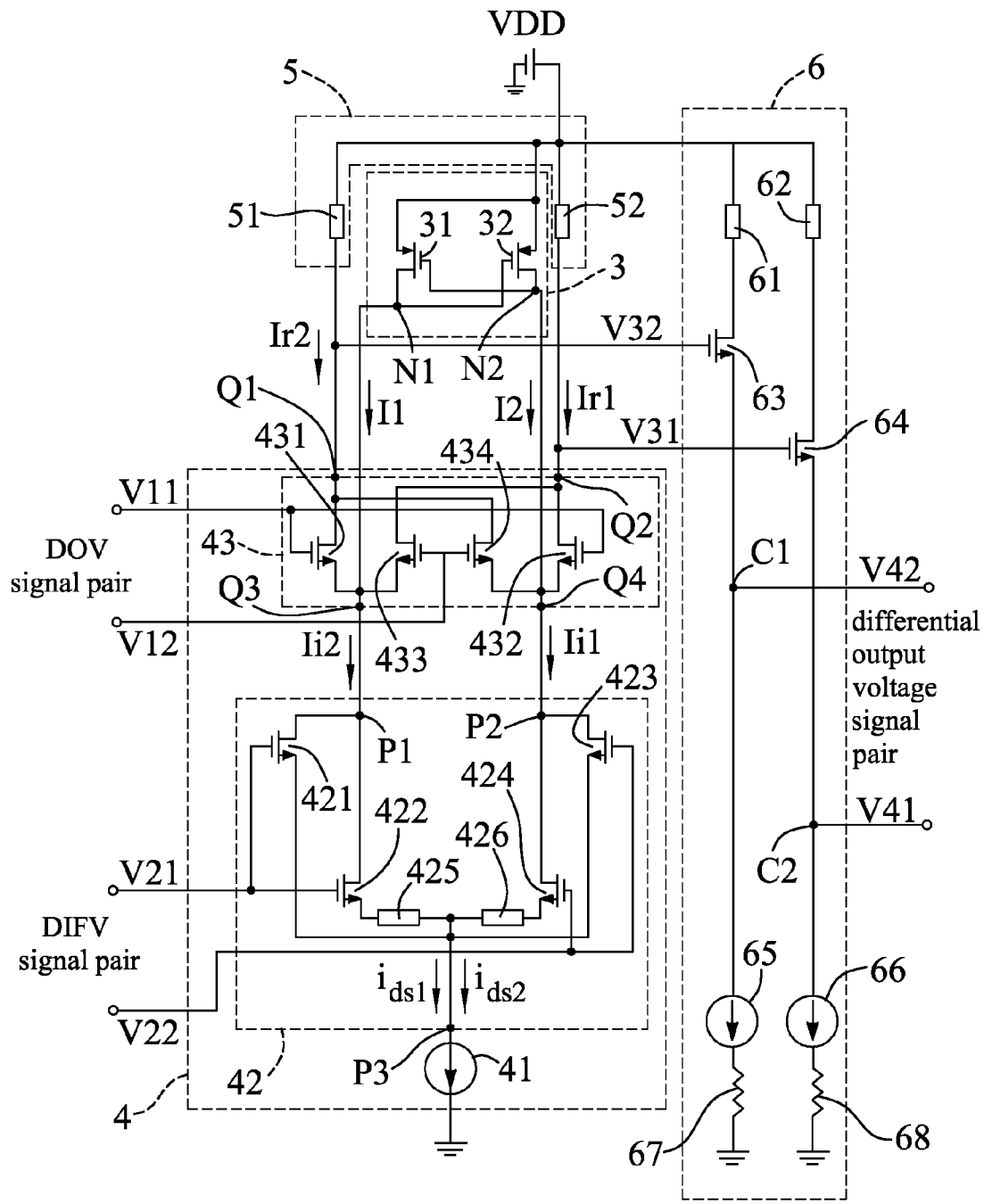
FIG. 3 is a schematic electrical circuit diagram of the embodiment.

Referring to FIGS. 2 and 3, the embodiment of a balanced up-conversion mixer according to the disclosure is shown to include a negative resistance compensation circuit 3, a mixing circuit 4, a load circuit 5 and a signal amplifier circuit 6.

The negative resistance compensation circuit 3 is used to receive a direct current (DC) bias voltage (VDD), and is configured to generate and output first and second currents (I1, I2) based on the DC bias voltage (VDD). In this embodiment, the negative resistance compensation circuit 3 includes a first transistor 31 and a second transistor 32.

Each of the first and second transistors 31, 32 has a first terminal, a second terminal and a control terminal. The first terminals of the first and second transistors 31, 32 are coupled with each other to receive the DC bias voltage (VDD). The control terminals of the first and second transistors 31, 32 are coupled respectively to the second terminals of the second and first transistors 32, 31. The first and second currents (I1, I2) flow out of the negative resistance compensation circuit 3 respectively through a common node (N1) between the second terminal of the first transistor 31 and the control terminal of the second transistor 32, and a common node (N2) between the control terminal of the first transistor 31 and the second terminal of the second transistor 32. It should be noted that each of the first and second transistors 31, 32 is, for example, a P-type metal-oxide-semiconductor field effect transistor (MOSFET), which has a source, a drain and a gate serving respectively as the first and second terminals and the control terminal thereof.

The mixing circuit 4 is coupled to the negative resistance compensation circuit 3 and the load circuit 5, and receives the first and second currents (I1, I2) from the negative resistance compensation circuit 3. The mixing circuit 4 is used to further receive a differential oscillating voltage (DOV) signal pair and a differential intermediate frequency voltage (DIFV) signal pair. The mixing circuit 4 is configured to allow, based on the first and second currents (I1, I2) and on the DOV and DIFV signal pairs, a differential radio frequency current (DRFC) signal pair flowing through the load circuit 5 to flow thereinto. In this embodiment, the DOV signal pair consists of positive-phase and negative-phase OV signals (V11, V12). The DIFV signal pair consists of positive-phase and negative-phase IFV signals (V21, V22). The DRFC signal pair consists of positive-phase and negative-phase RFC signals (Ir1, Ir2). The DRFC signal pair has a frequency (f1) associated with a frequency (f2) of the DOV signal pair and a frequency (f3) of the DIFV signal pair. It is noted that the frequency (f1) of the DRFC signal pair is, but not limited to, a sum of the frequencies (f2, f3) of the DOV and DIFV signal pairs (i.e., f1=f2+f3). For example, if f2=93.9 GHz and f3=0.1 GHz, then f1= 94 GHz (=93.9 GHz+0.1 GHz). In addition, the DOV and DIFV signal pairs used in this embodiment may be generated in a known manner.

In this embodiment, the mixing circuit 4 includes a current source 41, a transduction unit 42 and a mixing unit 43.

The current source 41 is used to modulate a total bias current flowing therethrough. The transduction unit 42 is coupled between the current source 41 and the negative resistance compensation circuit 3. The transduction unit 42 is used to receive the DIFV signal pair, and is configured to allow, based on the DIFV signal pair, a differential intermediate frequency current (DIFC) signal pair to flow therethrough and into the current source 41. In this case, the DIFC signal pair serves as the total bias current, and includes the first and second currents (I1, I2) from the negative resistance compensation circuit 3. The DIFC signal pair consists of positive-phase and negative-phase IFC signals (Ii1, Ii2). In this embodiment, the transduction unit 42 includes first and second input nodes (P1, P2), an output node (P3), first to fourth transistors 421, 422, 423, 424, and first and second inductors 425, 426.

The first and second input nodes (P1, P2) are coupled respectively to the common nodes (N1, N2) of the negative resistance compensation circuit 3. The negative-phase and positive-phase IFC signals (Ii2, Ii1) flow into the transduction unit 42 respectively through the first and second input nodes (P1, P2). The output node (P3) is coupled to the current source 41. The DIFC signal pair flows out of the transduction unit 42 through the output node (P3). The first transistor 421 is coupled between the first input node (P1) and the output node (P3). The second transistor 422 and the first inductor 425 are coupled in series between the first input node (P1) and the output node (P3). Each of the first and second transistors 421, 422 has a control terminal that is used to receive the positive-phase IFV signal (V21) such that the first and second transistors 421, 422 are operable to be conducting or non-conducting in response to the positive-phase IFV signal (V21). The third transistor 423 is coupled between the second input node (P2) and the output node (P3). The fourth transistor 424 and the second inductor 426 are coupled in series between the second input node (P2) and the output node (P3). Each of the third and fourth transistors 423, 424 has a control terminal that is used to receive the negative-phase IFV signal (V22) such that the third and fourth transistors 423, 424 are operable to be conducting or non-conducting in response to the negative-phase IFV signal (V22). Each of the first to fourth transistors 421, 422, 423, 424 further has a first terminal and a second terminal. The first terminals of the first and second transistors 421, 422 are coupled to the first input node (P1). The first terminals of the third and fourth transistors 423, 424 are coupled to the second input node (P2). The second terminals of the first and third transistors 421, 423 are coupled to the output node (P3). The second terminals of the second and fourth transistors 422, 424 are coupled respectively to the first and second inductors 425, 426. In this embodiment, each of the first to fourth transistors 421, 422, 423, 424 is, for example, an N-type MOSFET, which has a drain, a source and a gate serving respectively as the first and second terminals and the control terminal thereof. Each of the first and second inductors 425, 426 is, for example, a transmission line inductor.

Since a gate-source voltage ($V_{gs,422}$) of the second transistor 422 can be modulated by the first inductor 425, the first and second transistors 421, 422 can be seen as being coupled in parallel to each other. Therefore, drain-source currents ($i_{ds,421}$, $i_{ds,422}$) of the first and second transistors 421, 422, and a current ($i_{ds1}$) flowing into the output node (P3) and equal to a sum of the drain-source currents ($i_{ds,421}$, $i_{ds,422}$) can be expressed respectively by the following equations (1), (2), (3):

$$i_{ds,421} \approx g_{m1,421}V_{gs,421} + g_{m2,421}V_{gs,421}^2 + g_{m3,421}V_{gs,421}^3 \quad (1)$$

$$i_{ds,422} \approx g_{m1,422}V_{gs,422} + g_{m2,422}V_{gs,422}^2 - g_{m3,422}V_{gs,422}^3 \quad (2)$$

$$i_{ds1} \approx g_{m1,421}V_{gs,421} + g_{m2,421}V_{gs,421}^2 + g_{m1,422}V_{gs,422} + g_{m2,422}V_{gs,422}^2 \quad (3),$$

where $g_{m1,421}$ and $g_{m1,422}$ are respectively first-order transconductances of the first and second transistors 421, 422, $g_{m2,421}$ and $g_{m2,422}$ are respectively second-order transconductances of the first and second transistors 421, 422, $g_{m3,421}$ and $g_{m3,422}$ are respectively third-order transconductances of the first and second transistors 421, 422, and $V_{gs,421}$ is a gate-source voltage of the first transistor 421. In this case, when the first and second transistors 421, 422 act as ideal linear amplifiers, the expression for the current ($i_{ds1}$) can be simplified as the following equation (4).

$$i_{ds1} \approx 2g_{m1,421}V_{gs,421} + 2g_{m2,421}V_{gs,421}^2 \quad (4)$$

Therefore, the first inductor 425 can indeed improve linearity of the first and second transistors 421, 422.

Similarly, since a gate-source voltage ($V_{gs,424}$) of the fourth transistor 424 can be modulated by the second inductor 426, the third and fourth transistors 423, 424 can be seen coupled in parallel to each other. Accordingly, when the third and fourth transistors 423, 424 act as ideal linear amplifiers, a current ($i_{ds2}$) flowing into the output node (P3) and equal to a sum of drain-source currents ($i_{ds,423}$, $i_{ds,424}$) of the third and fourth transistors 423, 424 can be expressed by the following equation (5).

$$i_{ds2} \approx 2g_{m1,423}V_{gs,423} + 2g_{m2,423}V_{gs,423}^2 \qquad (5),$$

where $g_{m1,423}$ is a first-order transconductance of the third transistor 423, $g_{m2,423}$ is a second-order transconductance of the third transistor 423, and $V_{gs,423}$ is a gate-source voltage of the third transistor 423. Therefore, the second inductor 426 can indeed improve linearity of the third and fourth transistors 423, 424.

The mixing unit 43 is coupled between the transduction unit 42 and the load circuit 5. The mixing unit 43 is used to receive the DOV signal pair, and the DRFC signal pair flowing through the load circuit 5. The mixing unit 43 is configured to allow the DRFC signal pair to flow therethrough and into the transduction unit 42 based on the DOV signal pair. In this embodiment, the mixing unit 43 includes first and second input nodes (Q1, Q2), first and second output nodes (Q3, Q4), and first to fourth transistors 431, 432, 433, 434.

The first and second input nodes (Q1, Q2) are coupled to the load circuit 5. The negative-phase and positive-phase RFC signals (Ir2, Ir1) flow into the mixing unit 43 respectively through the first and second input nodes (Q1, Q2). The first and second output nodes (Q3, Q4) are coupled respectively to the first and second input nodes (P1, P2) of the transduction unit 42. The negative-phase and positive-phase RFC signals (Ir2, Ir1) flow out of the mixing unit 43 respectively through the first and second output nodes (Q3, Q4). The first transistor 431 is coupled between the first input node (Q1) and the first output node (Q3). The second transistor 432 is coupled between the second input node (Q2) and the second output node (Q4). Each of the first and second transistors 431, 432 has a control terminal that is used to receive the positive-phase OV signal (V11) such that the first and second transistors 431, 432 are operable to be conducting or non-conducting in response to the positive-phase OV signal (V11). The third transistor 433 is coupled between the second input node (Q2) and the first output node (Q3). The fourth transistor 434 is coupled between the first input node (Q1) and the second output node (Q4). Each of the third and fourth transistors 433, 434 has a control terminal that is used to receive the negative-phase OV signal (V12) such that the third and fourth transistors 433, 434 are operable to be conducting or non-conducting in response to the negative-phase OV signal (V12). It should be noted that each of the first to fourth transistors 431, 432, 433, 434 further has a first terminal and a second terminal. The first and second terminals of the first transistor 431 are coupled respectively to the first input node (Q1) and the first output node (Q3). The first and second terminals of the second transistor 432 are coupled respectively to the second input node (Q2) and the second output node (Q4). The first and second terminals of the third transistor 433 are coupled respectively to the second input node (Q2) and the first output node (Q3). The first and second terminals of the fourth transistor 434 are coupled respectively to the first input node (Q1) and the second output node (Q4). In this embodiment, each of the first to fourth transistors 431, 432, 433, 434 is, for example, an N-type MOSFET, which has a drain, a source and a gate serving respectively as the first and second terminals and the control terminal thereof.

When the first and second transistors 431, 432 conduct in response to the positive-phase OV signal (V11) while the third and fourth transistors 433, 434 do not conduct in response to the negative-phase OV signal (V12), the negative-phase RFC signal (Ir2) and the first current (I1) cooperatively constitute the negative-phase IFC signal (Ii2), and the positive-phase RFC signal (Ir1) and the second current (I2) cooperatively constitute the positive-phase IFC signal (Ii1). When the first and second transistors 431, 432 do not conduct in response to the positive-phase OV signal (V11) while the third and fourth transistors 433, 434 conduct in response to the negative-phase OV signal (V12), the positive-phase RFC signal (Ir1) and the first current (I1) cooperatively constitute the negative-phase IFC signal (Ii2), and the negative-phase RFC signal (Ir2) and the second current (I2) cooperatively constitute the positive-phase IFC signal (Ii1).

The load circuit 5 is used to receive the DC bias voltage (VDD), and outputs a differential radio frequency voltage (DRFV) signal pair based on its impedance, on the DC bias voltage (VDD) and on the DRFC signal pair. In this embodiment, the DRFV signal pair consists of positive-phase and negative-phase RF voltage signals (V31, V32). The load circuit 5 includes first and second inductors 51, 52.

Each of the first and second inductors 51, 52 has opposite first and second terminals. The first terminals of the first and second inductors 51, 52 are coupled with each other to receive the DC bias voltage (VDD). The second terminals of the first and second inductors 51, 52 are coupled respectively to the first and second input nodes (Q1, Q2) of the mixing unit 43. The load circuit 5 outputs the negative-phase and positive-phase RF voltage signals (V32, V31) respectively at the second terminals of the first and second inductors 51, 52. It is noted that each of the first and second inductors 51, 52 is, for example, a transmission line inductor.

The signal amplifier circuit 6 is used to receive the DC bias voltage (VDD), and is coupled to the load circuit 5 for receiving the negative-phase and positive-phase RF voltage signals (V32, V31) therefrom. The signal amplifier circuit 6 is configured to amplify the negative-phase and positive-phase RF voltage signals (V32, V31) so as to generate a differential output voltage signal pair. In this embodiment, the differential output voltage signal pair consists of positive-phase and negative-phase output voltage signals (V41, V42). The signal amplifier circuit 6 includes first and second inductors 61, 62, first and second transistors 63, 64, first and second current sources 65, 66, and first and second resistors 67, 68.

The first inductor 61, the first transistor 63, the first current source 65 and the first resistor 67 are coupled in series. The first inductor 61 is used to receive the DC bias voltage (VDD). The first transistor 63 is coupled between the first inductor 61 and the first current source 65. The first transistor 63 has a control terminal that is coupled to the second terminal of the first inductor 51 of the load circuit 5 for receiving the negative-phase RF voltage signal (V32) therefrom such that the first transistor 63 is operable to be conducting or non-conducting in response to the negative-phase RF voltage signal (V32). The first resistor 67 is coupled between the first current source 65 and ground. The negative-phase output voltage signal (V42) is outputted at a first common node (C1) between the first transistor 63 and the first current source 65. The second inductor 62, the second transistor 64, the second current source 66 and the second resistor 68 are coupled in series. The second inductor 62 is used to receive the DC bias voltage (VDD). The second transistor 64 is coupled between the second inductor 62 and the second current source 66. The second transistor 64 has a control terminal that is coupled to the second terminal of the second inductor 52 of the load circuit 5 for receiving the positive-phase RF voltage signal (V31) such that the second transistor 64 is operable to be conducting or non-conducting in response to the positive-phase RF voltage signal (V31). The second transistor 68 is coupled between the second current source 66 and ground. The positive-phase output voltage signal (V41) is outputted at a second common node (C2) between the second transistor 64 and the second current source 66. In some embodiments, the balanced up-conversion mixer can receive and convert the differential output voltage signal pair into an output voltage signal by a differential to single-ended converter (i.e., Balun, not shown), which is known to those skilled in the art and details of the same are omitted herein for the sake of brevity.

A conversion gain (CG) of the balanced up-conversion mixer can be expressed by the following equation (6):

$$CG = \frac{2}{\pi} \frac{G_{m,LO}}{(G_{m,LO} - g_{m31,32})} g_{m422,424}(\omega_{RF} L // R_6) \qquad (6)$$
$$= \frac{2}{\pi} \frac{G_{m,LO}}{(G_{m,LO} - g_{m31,32})} g_{m422,424} \omega_{RF} L,$$

where $G_{m,Lo}$ represents an equivalent input transconductance of the first and third transistors 431, 433 at the first output node (Q3) or an equivalent input transconductance of the second and fourth transistors 432, 434 at the second output node (Q4), $g_{m31,32}$ is an equivalent input transconductance of the first and second transistors 31, 32, $g_{m422,424}$ is an equivalent input transconductance of the second and fourth transistors 422, 424, $\omega_{RF}$ is an operating frequency of the balanced up-conversion mixer (i.e., the frequency of the DRFC signal pair of, for example, 94 GHz), L is an inductance of one of the first and second inductors 51, 52, and $R_6$ is an equivalent input impedance of the signal amplifier circuit 6 where, for example, $R_6 \cong \infty$.

It is known from the equation (6) that the conversion gain (CG) increases with increase of at least one of the transconductance ($g_{m31,32}$), which is smaller than the equivalent input transconductance ($G_{m,Lo}$), and the transconductance ($g_{m422,424}$). In addition, since the signal amplifier circuit 6 has a high input impedance, and is coupled in parallel to the load circuit 5, the signal amplifier circuit 6 can achieve impedance matching with a post-stage circuit (not shown), thereby avoiding reduction of the conversion gain (CG) due to loading effect caused by the post-stage circuit. For example, if the signal amplifier circuit 6 is omitted, the equivalent input impedance ($R_6$) becomes an equivalent output impedance of an output terminal of the balanced up-conversion mixer and as an example, $R_6 = 50\Omega$. In this case, the conversion gain (CG) may be decreased due to the loading effect caused by the post-stage circuit. Therefore, it is evident that the signal amplifier circuit 6 can enhance the conversion gain (CG) of this embodiment.

To sum up, upon DC analysis, since the DIFC signal pair consists of the DRFC signal pair and the first and second currents (I1, I2), the load circuit 5 of this disclosure consumes relatively low power as compared to the load circuit 1 of FIG. 1. In addition, since the conversion gain (CG) changes with change of the transconductances ($g_{m31,32}$, $g_{m422,424}$), the conversion gain (CG) of the balanced up-conversion mixer of this disclosure can be easily increased by appropriately selecting the transistors 31, 32, 422, 424 without increasing power consumption as is the case with the conventional Gilbert mixer. Furthermore, since the gate-source voltages of the second and fourth transistors 422, 424 can be modulated respectively by the first and second inductors 425, 426, the first to fourth transistors 421, 422, 423, 424 can all act as ideal linear amplifiers. Therefore, the transduction unit 42 of this disclosure has improved linearity.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A balanced up-conversion mixer comprising:
    a negative resistance compensation circuit used to receive a direct current (DC) bias voltage, and configured to generate and output a first current and a second current based on the DC bias voltage;
    a load circuit used to receive the DC bias voltage; and
    a mixing circuit coupled to said negative resistance compensation circuit and said load circuit for receiving the first and second currents therefrom, and used to further receive a differential oscillating voltage signal pair and a differential intermediate frequency (IF) voltage signal pair, said mixing circuit being configured to allow a differential radio frequency (RF) current signal pair, which flows through said load circuit, to flow thereinto based on the first and second currents, the differential oscillating voltage signal pair and the differential IF voltage signal pair, the differential RF current signal pair having a frequency associated with those of the differential oscillating voltage signal pair and the differential IF voltage signal pair;
    wherein said load circuit outputs a differential RF voltage signal pair based on an impedance thereof, the DC bias voltage and the differential RF current signal pair;
    wherein said mixing circuit includes
    a current source used to modulate a total bias current flowing therethrough,
    a transduction unit coupled between said current source and said negative resistance compensation circuit and used to receive the differential IF voltage signal pair, said transduction unit being configured to allow a differential intermediate frequency (IF) current signal pair to flow into said current source therethrough based on the differential IF voltage signal pair, the differential IF current signal pair including the first and second currents and serving as the total bias current, and
    a mixing unit coupled between said transduction unit and said load circuit and used to receive the differential oscillating voltage signal pair, and the differential RF current signal pair flowing through said load circuit, said mixing unit being configured to allow, based on the differential oscillating voltage signal pair, the differential RF current signal pair to flow therethrough and into said transduction unit, the differential RF current signal pair and the first and second currents cooperatively constituting the differential IF current signal pair;
    the differential IF voltage signal pair including a positive-phase IF voltage signal and a negative-phase IF voltage signal, wherein:
    the differential IF current signal pair includes a positive-phase IF current signal and a negative-phase IF current signal; and said transduction unit includes
- a first input node and a second input node coupled to said mixing unit and said negative resistance compensation circuit, the negative-phase and positive-phase IF current signals flowing into said transduction unit respectively through said first and second input nodes,
- an output node coupled to said current source, the differential IF current signal pair flowing out of said transduction unit through said output node,
- a first transistor coupled between said first input node and said output node, said first transistor having a control terminal used to receive the positive-phase IF voltage signal such that said first transistor is operable to be conducting or non-conducting in response to the positive-phase IF voltage signal,
- a second transistor and a first inductor coupled in series between said first input node and said output node, said second transistor having a control terminal used to receive the positive-phase IF voltage signal such that said second transistor is operable to be conducting or non-conducting in response to the positive-phase IF voltage signal,
- a third transistor coupled between said second input node and said output node, said third transistor having a control terminal used to receive the negative-phase IF voltage signal such that said third transistor is operable to be conducting or non-conducting in response to the negative-phase IF voltage signal, and
- a fourth transistor and a second inductor coupled in series between said second input node and said output node, said fourth transistor having a control terminal used to receive the negative-phase IF voltage signal such that said fourth transistor is operable to be conducting or non-conducting in response to the negative-phase IF voltage signal.

2. The balanced up-conversion mixer of claim 1, wherein said negative resistance compensation circuit includes
- a first transistor and a second transistor, each of which has a first terminal, a second terminal and a control terminal, said first terminals of said first and second transistors being coupled with each other and used to receive the DC bias voltage, said control terminal of said first transistor being coupled to said second terminal of said second transistor, said control terminal of said second transistor being coupled to said second terminal of said first transistor, the first and second currents flowing out of said negative resistance compensation circuit respectively through a common node between said second terminal of said first transistor and said control terminal of said second transistor, and a common node between said control terminal of said first transistor and said second terminal of said second transistor.

3. The balanced up-conversion mixer of claim 2, wherein each of said first and second transistors is a P-type metal-oxide-semiconductor field effect transistor (MOSFET) having a source, a drain and a gate that respectively serve as said first terminal, said second terminal and said control terminal of the corresponding one of said first and second transistors.

4. The balanced up-conversion mixer of claim 1, wherein:
the differential RF voltage signal pair includes a positive-phase RF voltage signal and a negative-phase RF voltage signal; and
said load circuit includes a first inductor and a second inductor, each of which has opposite first and second terminals, said first terminals of said first and second inductors being coupled with each other and used to receive the DC bias voltage, said second terminals of said first and second inductors being used to respectively output the negative-phase RF voltage signal and the positive-phase RF voltage signal.

5. The balanced up-conversion mixer of claim 1, the differential oscillating voltage signal pair including a positive-phase oscillating voltage signal and a negative-phase oscillating voltage signal, wherein:
the differential RF current signal pair includes a positive-phase RF current signal and a negative-phase RF current signal; and
said mixing unit includes
- a first input node and a second input node coupled to said load circuit, the negative-phase and positive-phase RF current signals flowing into said mixing unit respectively through said first and second input nodes,
- a first output node and a second output node coupled to said transduction unit, the differential RF current signal pair flowing out of said mixing unit through said first and second output nodes,
- a first transistor coupled between said first input node and said first output node, said first transistor having a control terminal used to receive the positive-phase oscillating voltage signal such that said first transistor is operable to be conducting or non-conducting in response to the positive-phase oscillating voltage signal,
- a second transistor coupled between said second input node and said second output node, said second transistor having a control terminal used to receive the positive-phase oscillating voltage signal such that said second transistor is operable to be conducting or non-conducting in response to the positive-phase oscillating voltage signal,
- a third transistor coupled between said second input node and said first output node, said third transistor having a control terminal used to receive the negative-phase oscillating voltage signal such that said third transistor is operable to be conducting or non-conducting in response to the negative-phase oscillating voltage signal, and
- a fourth transistor coupled between said first input node and said second output node, said fourth transistor having a control terminal used to receive the negative-phase oscillating voltage signal such that said fourth transistor is operable to be conducting or non-conducting in response to the negative-phase oscillating voltage signal.

6. The balanced up-conversion mixer of claim 1, further comprising:
a signal amplifier circuit used to receive the DC bias voltage and coupled to said load circuit for receiving the differential RF voltage signal pair therefrom, said signal amplifier circuit being configured to amplify the differential RF voltage signal pair so as to generate a differential output voltage signal pair.

7. The balanced up-conversion mixer of claim 6, wherein:
the differential RF voltage signal pair includes a positive-phase RF voltage signal and a negative-phase RF voltage signal, and the differential output voltage signal pair includes a positive-phase output voltage signal and a negative-phase output voltage signal; and
said signal amplifier circuit includes
a series connection of a first inductor, a first transistor, a first current source and a first resistor, said first inductor being used to receive the DC bias voltage, said first transistor being coupled between said first inductor and said first current source, and having a control terminal coupled to said load circuit for receiving the negative-phase RF voltage signal therefrom such that said first transistor is operable to be conducting or non-conducting in response to the negative-phase RF voltage signal, said first resistor being coupled between said first current source and ground, the negative-phase output voltage signal being outputted at a first common node between said first transistor and said first current source; and a series connection of a second inductor, a second transistor, a second current source and a second transistor, said second inductor being used to receive the DC bias voltage, said second transistor being coupled between said second inductor and said second current source, and having a control terminal coupled to said load circuit for receiving the positive-phase RF voltage signal such that said second transistor is operable to be conducting or non-conducting in response to the positive-phase RF voltage signal, said second transistor being coupled between said second current source and ground, the positive-phase output voltage signal being outputted at a second common node between said second transistor and said second current source.

* * * * *